(12) United States Patent
Won

(10) Patent No.: US 6,327,203 B1
(45) Date of Patent: Dec. 4, 2001

(54) MEMORY DEVICE HAVING MINIMIZED POWER CONSUMPTION AND DATA READ AND WRITE METHOD OF THE SAME

(75) Inventor: Jong-hak Won, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/550,301

(22) Filed: Apr. 14, 2000

(30) Foreign Application Priority Data

Jun. 29, 1999 (KR) .................................................. 99-25340

(51) Int. Cl.$^7$ ....................................................... G11C 7/00
(52) U.S. Cl. ...................... 365/205; 365/189.07; 365/207
(58) Field of Search ..................................... 365/205, 207, 365/189.05, 189.07, 189.08

(56) References Cited

U.S. PATENT DOCUMENTS

| 5,363,330 | * | 11/1994 | Kobayashi et al. | ................... 365/185 |
| 5,684,750 | * | 11/1997 | Kondoh et al. | ....................... 365/205 |
| 5,710,736 | * | 1/1998 | Masuda et al. | .................. 365/139.07 |
| 6,031,785 | * | 2/2000 | Park et al. | ....................... 365/230.08 |
| 6,122,203 | * | 9/2000 | Hunt et al. | ....................... 365/189.05 |

\* cited by examiner

*Primary Examiner*—Richard Elms
*Assistant Examiner*—Hien Nguyen
(74) *Attorney, Agent, or Firm*—Skjerven Morrill MacPherson LLP; David W. Heid

(57) ABSTRACT

A memory device having reduced power consumption by minimizing the operation of circuits utilized in reading and writing data, and a data reading and writing method of the memory device, are provided. In the memory device, upon data reading, an input and output sense amplifier amplifies data which is read from a memory cell and transferred to an input and output line, and transfers the resultant data to a data output line. Upon data writing, a writing driver receives write data via a data input line and transfers the received write data to the input and output line. Each of the input and output sense amplifier and the writing driver operates only when previously-read or -written data is different from current data to be read or written.

10 Claims, 5 Drawing Sheets

MEMORY DEVICE HAVING MINIMIZED POWER CONSUMPTION AND DATA READ AND WRITE METHOD OF THE SAME

BACKGROUND OF THE INVENTION

1. Field of the Invention

The present invention relates to semiconductor devices, and more particularly, to a memory device having minimized power consumption upon reading or writing, and a data reading, and writing method for accomplishing reduced power reading and writing of data.

2. Description of the Related Art

Semiconductor devices such as a dynamic random access memory (DRAM) generally repeat reading and writing of data. However, reading and writing of data consumes a considerable amount of power.

For example, upon reading of data, a bit line sense amplifier senses and amplifies data transferred to a pair of bit lines and transmits the resultant data to a pair of input and output lines. An input and output sense amplifier senses and amplifies data transferred to the pair of input and output lines. The bit line sense amplifier the input and output sense amplifier each consume a certain amount of power during their operation.

Also, upon writing of data, a writing driver transmits write data received from a data input buffer to a pair of input and output lines. The writing driver also consumes a certain amount of power whenever it operates.

In particular, recently, there has been an increasing demand for a semiconductor memory device having a large bandwidth, i.e., a large amount of input and output (IO) data transmitted per unit time, with the development of multimedia applications. Accordingly, semiconductor memory devices having high bandwidths of X16, X32, X64, etc. have been developed. This increase of the bandwidth increases the number of data output terminals, which consequently increases the number of input and output sense amplifiers and writing drivers. Therefore, the amount of power which is consumed by the input and output sense amplifiers and writing drivers is also increased.

SUMMARY OF THE INVENTION

In accordance with the present invention, a memory device is provided for reading and writing of data to a memory, the memory device comprising an input and output sense amplifier for amplifying data read from a memory cell of the memory and transferred to an input and output line, and transferring the read data to a data output line; and a writing driver circuit for receiving write data via a data input line and transferring the received write data to the input and output line, wherein each of the input and output sense amplifier and the writing driver circuit operates only when previously-read or previously-written data is different from current data to be read or written.

In accordance with another aspect of the present invention, the memory device further comprises an input and output sense amplifier driving unit for generating an input and output sense amplifier driving signal to control the input and output sense amplifier such that the input and output sense amplifier is deactivated when previously read data on the data output line is the same as current read data on the input and output line, and to activate the input and output sense amplifier when the previously read data is different from the current read data; and a writing driver driving circuit for generating a writing driver driving signal for controlling the writing driver such that the writing driver is deactivated when previous write data on the input and output line is the same as current write data on the data input line, and generating a writing driver driving signal to activate the writing driver when the previous write data is different from the current write data.

In accordance with a further aspect of the present invention, a memory device is provided which transfers data read from a selected memory cell to an input and output line and outputs the data via a data output line, the device comprising: an input and output sense amplifier which amplifies data read from the memory cell and transfers the amplified data an output of the sense amplifier; a latch unit having an input coupled to the output of the sense amplifier for receiving and latching data received from the output of the sense amplifier, and providing the latched data to an output of the latch units; and an input and output sense amplifier driving unit coupled to the input and output line and to the latch unit for comparing previously read data on the data output line with current read data on the input and output line, and generating an input and output sense amplifier driving signal for activating or deactivating the input and output sense amplifier as a function of the result of the comparison.

In the memory device according to the immediately preceding aspect of the present invention, the input and output sense amplifier driving signal is deactivated when the previous read data on the data output line is the same as the current read data on the input and output line, and activated when the previous read data is different from the current read data.

In accordance with another aspect of the present invention, a memory device is provided which transfers write data, which is received from an external source via a data input line, to an input and output line, and writes the write data to a selected memory cell, the device comprising: a writing driver which transfers the write data received via the data input line, to the input and output line; and a writing driver driving unit which compares the write data on the data input line with the write data on the input and output line, and generates a writing driver driving signal for controlling the writing driver, wherein the writing driver operates only when previous write data is different from current write data.

In another aspect, in the memory device according to the immediately preceding aspect, the writing driver driving signal is deactivated when previous write data on the input and output line is the same as current write data on the data input line, and activated when the previous write data is different from the current write data.

According to a further aspect of the present invention, a data reading/writing method is provided for a memory device including an input and output sense amplifier for amplifying data which has been read from a memory cell and transferred to an input and output line, and transferring the resultant data to a data output line, and a writing driver for receiving write data via a data input line and transferring the received write data to the input and output line, the method comprising the steps of: (a) comparing previously-read data on the data output with current read data, which is on the input and output line, and comparing previously-written data on the input and output line with current data to be written which is on the data input line; and (b) generating a control signal for enabling or disabling the input and output sense amplifier and the writing driver as a function of the results of the comparison.

Additionally, in another aspect of the present invention, in the above method the control signal is deactivated when the previously-read/written data is the same as the current data to be read/written, and activated when the previously-read/written data is different from the current data to be read/written.

BRIEF DESCRIPTION OF THE DRAWINGS

The above objects and advantages of the present invention will become more apparent by reference to the detailed description below in connection with the following drawings in which.

DESCRIPTION OF THE PREFERRED EMBODIMENT

Figure 1:
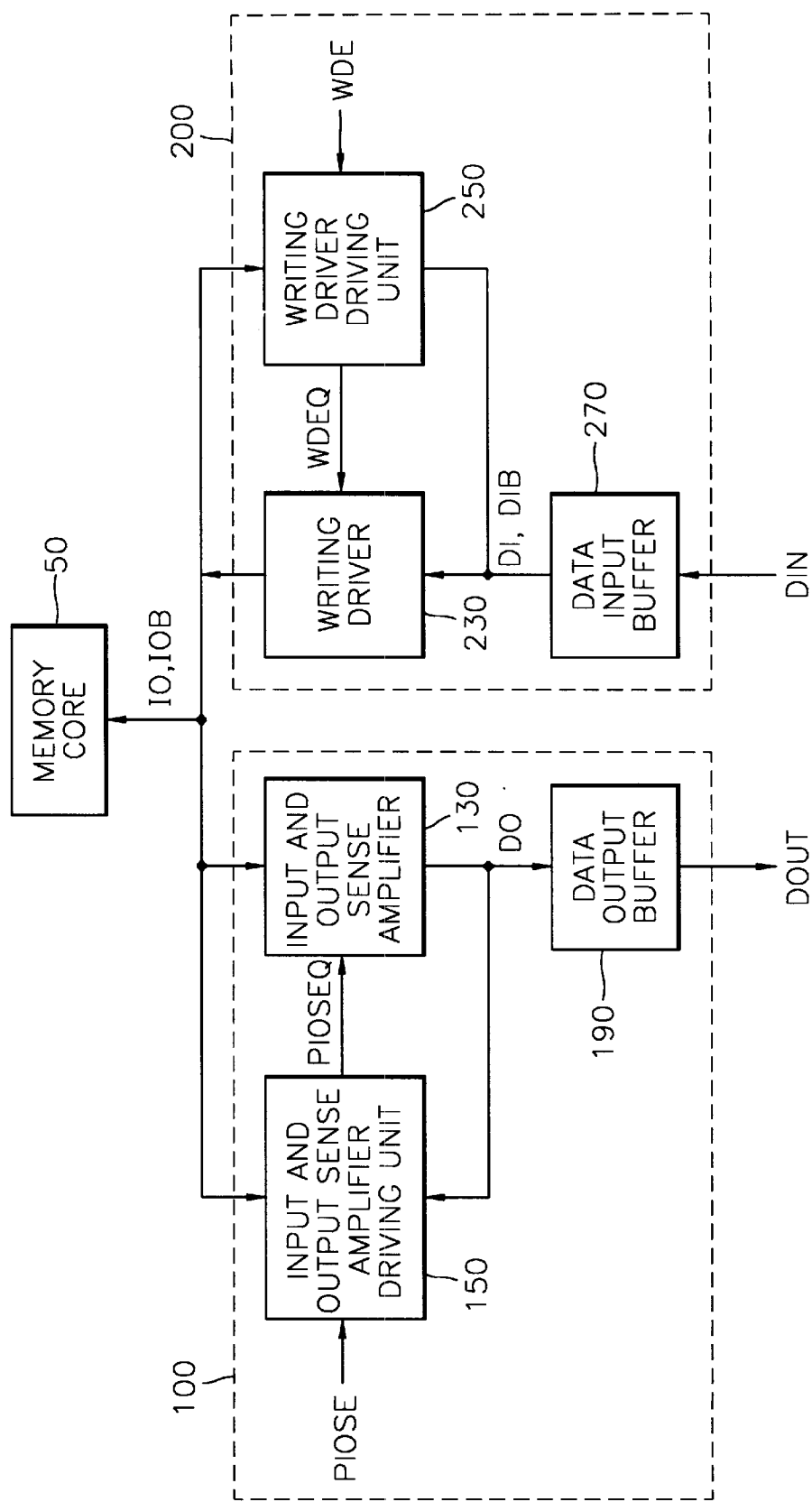
FIG. 1 is a block diagram of a memory device according to an embodiment of the present invention.

Hereinafter, the present invention will be described in detail by explaining an embodiment of the present invention with reference to the drawings. Like reference numerals in the drawings denote the same structures.

Referring to FIG. 1, a memory device according to an embodiment of the present invention includes a memory core 50, a data output circuit 100, and a data input circuit 200. Both the data output circuit 100 and the data input circuit 200 are positioned on data reading and writing paths. The data output circuit 100 includes an input and output sense amplifier 130, an input and output sense amplifier driving unit 150, and a data output buffer 190. The data input circuit 200 includes a writing driver 230, a writing driver driving unit 250, and a data input buffer 270.

Data transmission between the memory core 50 and the data output circuit 100 and the data input circuit 200 is achieved via a pair of input and output lines IO and IOB. Data transmission within the data output circuit 100 and the data input circuit 200 is carried out via a data output line DO and via a pair of data input lines DI and DIB, respectively.

That is, data read from a selected memory cell within the memory core 50 is transferred to the data output circuit 100 via the pair of input and output lines IO and IOB. The read data is sensed and amplified by the input and output sense amplifier 130, transferred to the data output buffer 190 via the data output line DO, and output as output data DOUT.

In a writing operation, write data is applied to the data input buffer 270 of the data input circuit 200, and is transferred to the writing driver 230 via the pair of data input lines DI and DIB. The input write data DIN is written to a selected memory cell within the memory core 50 via the pair of input and output lines IO and IOB.

According to a preferred embodiment of the present invention, upon reading, the data output circuit 100 compares current data to be read (received via the pair of input and output lines IO and IOB), with data on the data output line DO, that is, previously-read data, using the input and output sense amplifier driving unit 150. The input and output sense amplifier 130 is commanded to operate only when the two data are different from each other, thus reducing power consumption due to unnecessary operation. The configuration and operation of the data output circuit 100 is described in detail below, with reference to FIGS. 2 through 4.

Likewise, upon writing, the data input circuit 200 compares the current write data received via the pair of data lines DIO and DIOB, with data on the pair of input and output lines IO and IOB, that is, the previous write data, using the writing driver driving unit 250. The writing driver 230 is commanded to operate only when the two data are different from each other, thus reducing power consumption due to unnecessary operation. The configuration and operation of the data input circuit 200 is described in detail below, with reference to FIGS. 5 through 7.

As described above, according to the present invention, the pre-detection as to whether the current read or write data is the same as the previous data minimizes the number of operations of circuits used in reading or writing of data, for example, the input and output sense amplifier 130 or the writing driver 230, resulting in reduced in power consumption.

Figure 2:
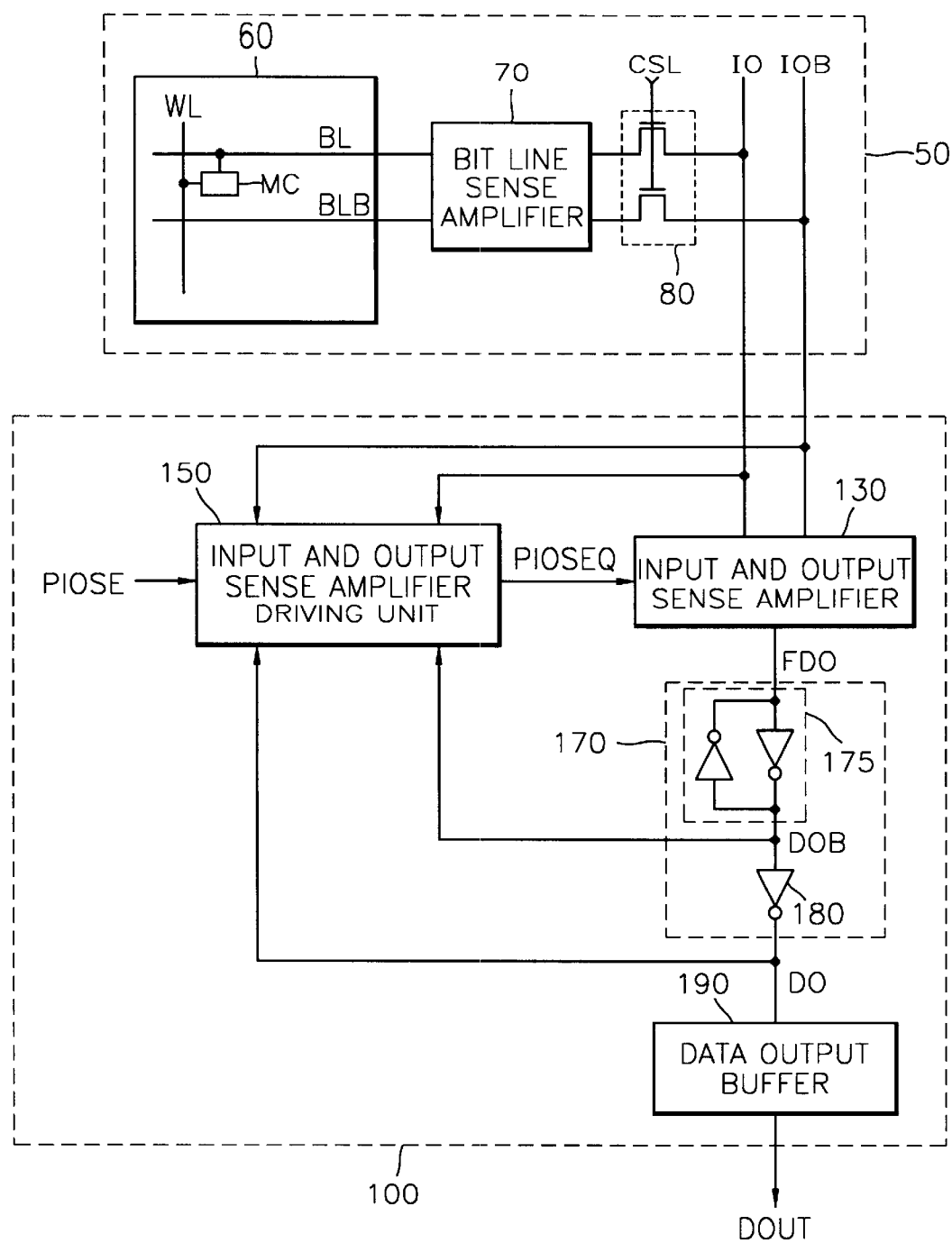
FIG. 2 is a block diagram schematically illustrating a data output path according to one embodiment of the present invention.

FIG. 2 is a schematic block diagram illustrating circuits which are positioned on a data output path according to an embodiment of the present invention, which shows the memory core 50 and the data output circuit 100. Referring to FIG. 2, the memory core 50 includes a memory array 60, a bit line sense amplifier 70, and a column switch 80.

The memory array 60 includes a plurality of memory cells MC which are arranged on the intersections of word lines WL and bit lines BL. The bit line sense amplifier 70 senses and amplifies data on a selected pair of bit lines BL and BLB. The column switch 80 connects the selected pair of bit lines BL and BLB to the pair of input and output lines IO and IOB in response to the activation of a column selection signal CSL.

The data output circuit 100 includes the input and output sense amplifier 130, the input and output sense amplifier driving unit 150, a latch unit 170, and the data output buffer 190.

The input and output sense amplifier 130 senses and amplifies data received via the pair of input and output lines IO and IOB, and outputs the resultant data as output data FDO. According to the present embodiment, the input and output sense amplifier 130 operates in response to an input and output sense amplifier driving signal PIOSEQ. The input and output sense amplifier 130 is described in detail below with reference to FIG. 4.

The latch unit 170 latches read data FDO output by the input and output sense amplifier 130 for a predetermined period of time. It is preferable that the latch unit 170 includes a latch 175 and an inverter 180. The latch 175 inversely latches the read data FDO amplified by the input and output sense amplifier 130. The output of the latch 175 is transferred to a complementary data output line DOB. The inverter 180 inverts the output signal of the latch 175, and the resultant signal is transferred to the data output line DO.

The input and output sense amplifier driving unit 150 is connected to the pair of input and output lines IO and IOB and the pair of data output lines DO and DOB. The input and output sense amplifier driving unit 150 generates the input and output sense amplifier driving signal PIOSEQ for driving the input and output sense amplifier 130, in response to an input and output sense amplifier enable signal PIOSE which activates when the memory device to enter a read mode.

The input and output sense amplifier driving unit 150 compares current read data received via the pair of input and output lines IO and IOB, with data on the pair of data output lines DO and DOB which was previously read and latched by the latch unit 170. Then, the input and output sense amplifier driving unit 150 generates the input and output sense amplifier driving signal PIOSEQ for enabling or disabling the input and output sense amplifier 130 depending on the results of the comparison made by the input and output sense amplifier driving unit 150. The input and output sense amplifier driving signal PIOSEQ disables the input and output sense amplifier 130 when the two data are the same, and enables the same when they are different from each other.

Figure 3:
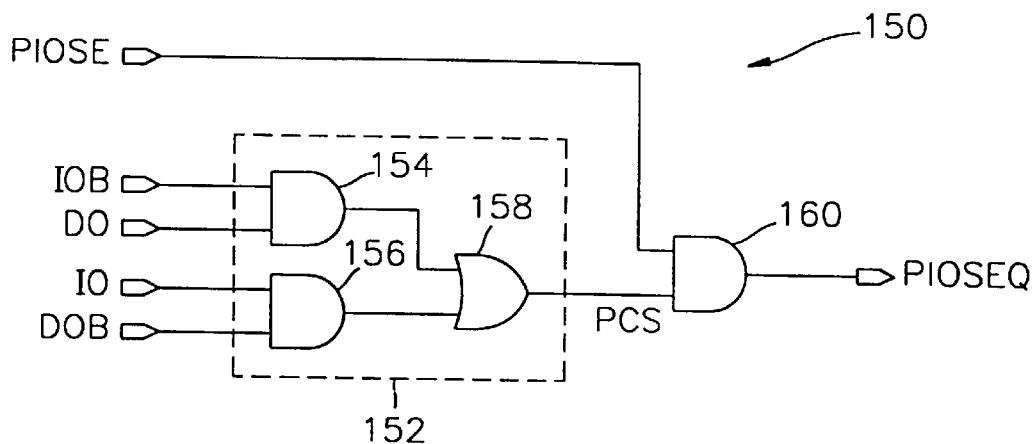
FIG. 3 is a circuit diagram of the input and output sense amplifier driving unit shown in FIG. 2.

Referring to FIG. 3, which is a circuit diagram illustrating the input and output sense amplifier driving unit 150 shown in FIG. 2, the input and output sense amplifier driving unit 150 includes a comparing unit 152 and a logic unit 160. The comparing unit 152 compares data received via the pair of input and output lines IO and IOB with data received via the pair of data output lines DO and DOB, and generates a control signal PCS. Preferably, the control signal PCS has a logic low level when the signal logic levels of the input and output line IO and the data output line DO are the same, and has a logic high level when they are different from each other. Also, it is preferable that the comparing unit 152 includes first through third logic gates 154, 156 and 158.

The first logic gate 154 may be a 2-input AND gate for receiving signals transmitted via the complementary input and output line IOB and the data output line DO. The second logic gate 156 may be a 2-input AND gate for receiving signals transmitted via the input and output line IO and the complementary data output line DOB. The third logic gate 158 may be a 2-input OR gate for receiving the output signals of the first and second AND gates 154 and 156.

The logic unit 160 receives the input and output sense amplifier enable signal PIOSE and the control signal PCS, and generates the input and output sense amplifier driving signal PIOSEQ. Preferably, the logic unit 160 is a 2-input AND gate.

The input and output sense amplifier driving circuit 150 having such a configuration generates a logic low level input and output sense amplifier driving signal PIOSEQ when the signal logic levels of the input and output line IO and the data output line DO are the same, even if a memory device enters into a data read mode and the input and output sense amplifier enable signal PIOSE is activated to a logic high level. A logic high level input and output sense amplifier driving signal PIOSEQ is generated only when the signal logic levels of the input and output line IO and the data output line DO are different from each other.

Figure 4:
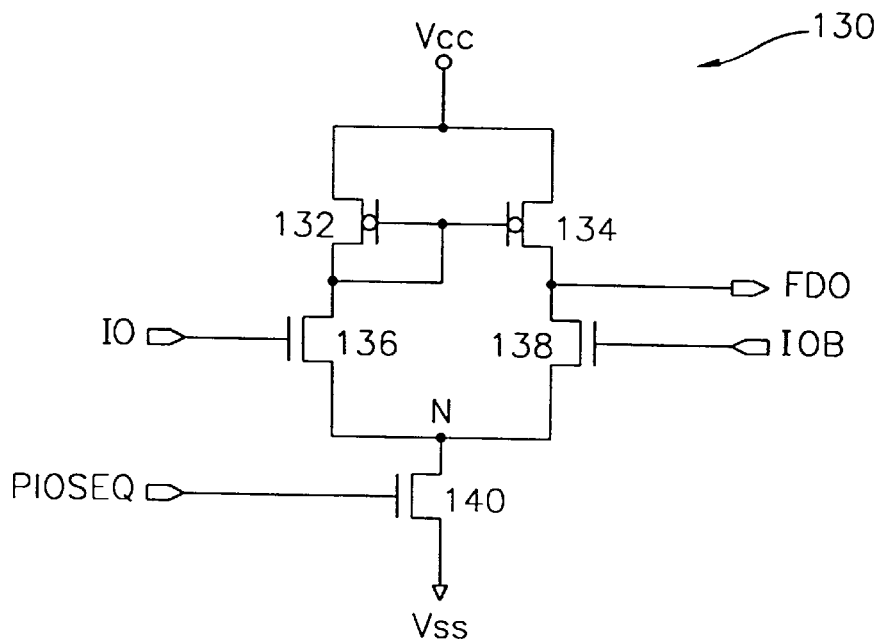
FIG. 4 is a circuit diagram of the input and output sense amplifier shown in FIG. 2.

Referring to FIG. 4, which is a circuit diagram illustrating the input and output sense amplifier 130 shown in FIG. 2, the input and output sense amplifier 130 may be a current mirror type of differential amplifier. The input and output sense amplifier 130 is enabled in response to the activation of the input and output sense amplifier driving signal PIOSEQ, and differentially amplifies data received from the pair of input and output lines IO and IOB and outputs the resultant data as output data FDO. Preferably, the input and output sense amplifier 130 includes first and second PMOS transistors 132 and 134, first and second NMOS transistors 136 and 138, and a switch 140.

The switch 140 is enabled by the input and output sense amplifier driving signal PIOSEQ, and controls the operation of the input and output sense amplifier 130. That is, when the input and output sense amplifier driving signal PIOSEQ is at a logic high level, the switch 140 acts as a current source. Thus, a node N is driven toward a ground level VSS, and the input and output sense amplifier 130 is enabled. Conversely, when the input and output sense amplifier driving signal PIOSEQ is at a logic low level, the switch 140 is turned off, so that current is blocked. Thus, the input and output sense amplifier 130 is disabled. The configuration and operational effects of the current mirror type differential amplifier are apparent to those skilled in the art, so they will not be described in detail.

Referring back to FIGS. 2 through 4, when previously-read data and current data to be read are the same, the input and output sense amplifier 130 is disabled, but when they are different from each other, the input and output sense amplifier 130 is enabled. That is, when previously-read data and current data to be read are the same even though the input and output sense amplifier enable signal PIOSE is activated, the input and output sense amplifier 130 is disabled. That is, the input and output sense amplifier 130 is prevented from operating, thus reducing power consumption due to unnecessary operation of the input and output sense amplifier 130.

Figure 5:
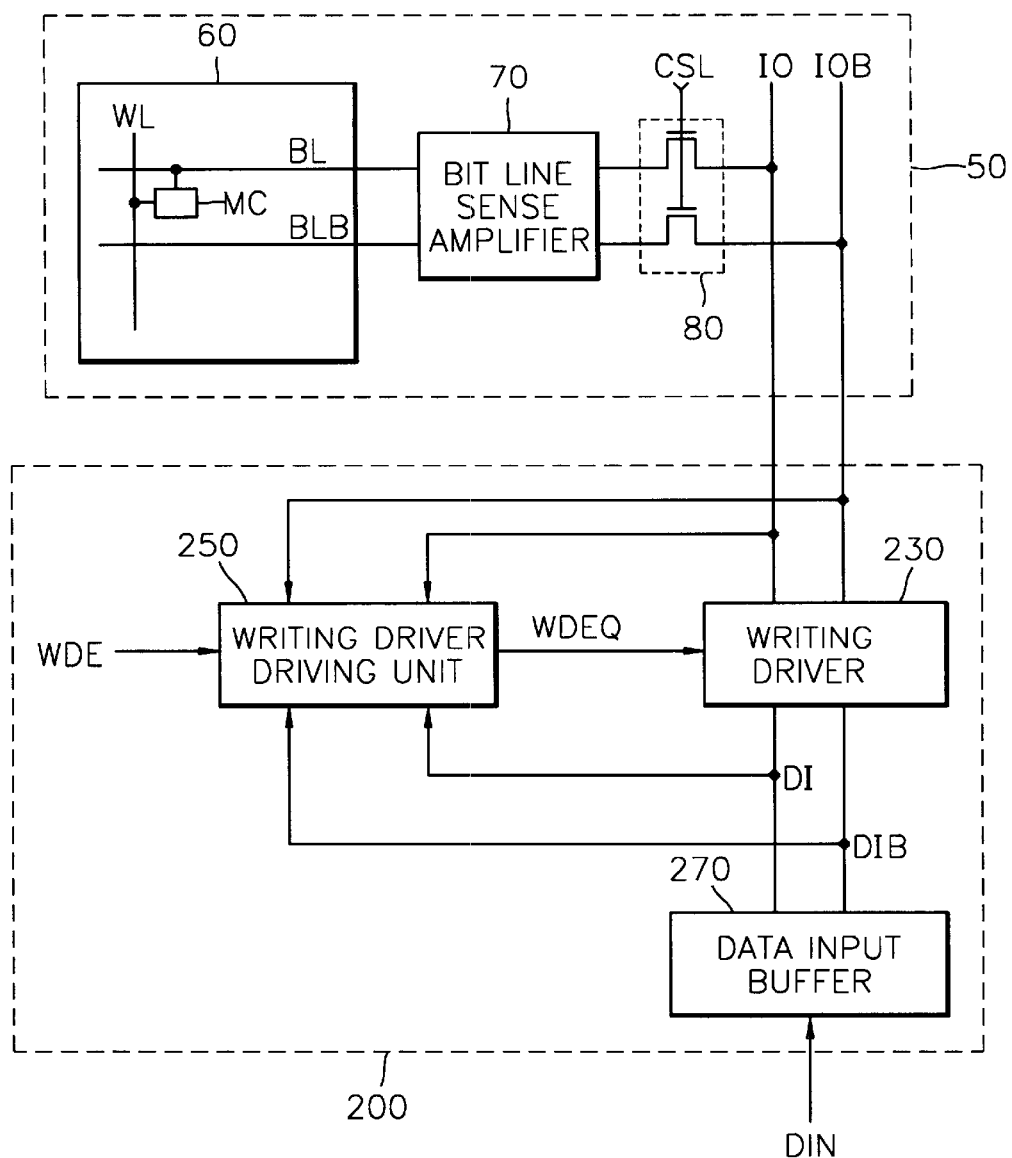
FIG. 5 is a block diagram schematically illustrating a data input path according to an embodiment of the present invention.

FIG. 5 is a schematic block diagram illustrating circuits positioned on a data input path according to an embodiment of the present invention, in which the circuits are the memory core 50 and the data input circuit 200. Here, the same reference numerals as those of FIG. 2 denote the same members. Referring to FIG. 5, the data input circuit 200 transmits write data DIN received from an external source, to the pair of input and output lines IO and IOB via the pair of data input lines DI and DIB. Preferably, the data input circuit 200 includes the writing driver 230, the writing driver driving unit 250, and the data input buffer 270.

The writing driver 230 transmits data received via the pair of data input lines DI and DIB, to the pair of input and output lines IO and IOB, and operates under the control of a writing driver driving signal WDEQ in the present embodiment. The writing driver 230 is described in detail below, with reference to FIG. 7.

The writing driver driving unit 250 is connected to the pair of input and output lines IO and IOB and the pair of data input lines DI and DIB, and generates the writing driver driving signal WDEQ in response to a writing driver enable signal WDE which is activated when the memory device enters into a writing mode. In operation, the writing driver driving unit 250 compares current write data which is received via the pair of data input lines DI and DIB, with previously-written data on the pair of input and output lines IO and IOB. Then, the writing driver driving unit 250 generates the writing driver driving signal WDEQ for enabling or disabling the writing driver 230 depending on the results of the comparison. The writing driver driving signal WDEQ disables the writing driver 230 when the current write data and the previously-written data are the same, and enables writing driver 230 when they are different from each other.

Therefore, when previously written data is the same as current data to be written, the writing driver 230 is disabled in response to the deactivation of the writing driver driving signal WDEQ. On the other hand, when the previous write data and the current write data are different from each other, the writing driver driving signal WDEQ is activated, so that the writing driver 230 is enabled. As described above, the writing driver 230 operates only when the previously-written data is different from the current data to be written, so that power consumption due to unnecessary operation of the writing driver 230 is avoided.

Figure 6:
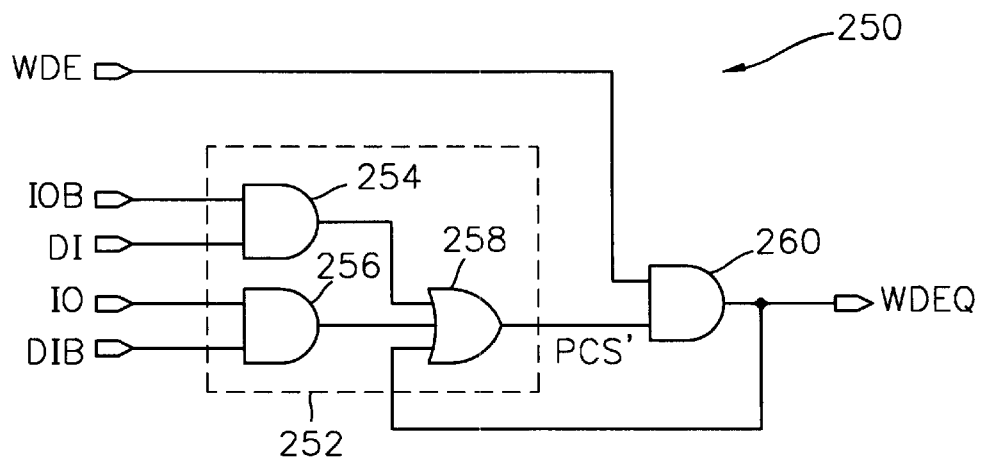
FIG. 6 is a circuit diagram of the writing driver driving unit shown in FIG. 5.

Referring to FIG. 6, which is a circuit diagram illustrating the writing driver driving unit 250 shown in FIG. 5, the writing driver driving unit 250 includes a comparing unit 252 and a logic unit 260. The writing driver driving unit 250 is constructed with many of the same logic elements as used in input and output sense amplifier driving unit 150 shown in FIG. 3, however, the input and output signals of the logic unit 260 are signals WDE and WDEQ associated with writing driver 230, respectively, and that the output signal of the logic unit 260 is fed back to the comparing unit 252.

That is, similar to the comparing unit 152 in the input and output sense amplifier driving unit 150 of FIG. 2, the comparing unit 252 compares data of the pair of input and output lines IO and IOB with data of the pair of data lines DIO and DIOB, and generates a control signal PCS'. The comparing unit 252 includes first through third logic gates 254, 256 and 258.

Similar to the first and second logic gates 154 and 156 in the input and output sense amplifier driving unit 150 of FIG. 2, each of the first and second logic gates 254 and 256 may be a 2-input AND gate which is connected to the pair of input and output lines IO and IOB and the pair of data input lines DI and DIB. Also, the third logic gate 258 may be a 3-input OR gate for receiving the output signals of the first and second AND gates 254 and 256 and the output signal of the logic unit 260.

The logic unit 260 receives the writing driver enable signal WDE and the control signal PCS', and generates the writing driver driving signal WDEQ. Preferably, the logic unit 260 is a 2-input AND gate.

The writing driver driving circuit 250 having such a configuration generates a logic low level writing driver driving signal WDEQ when the signal levels of the input and output line IO and the data input line DIO are the same. Accordingly, even if a memory device enters into a write mode and the writing driver enable signal WDE is activated to a logic high level, the writing driver 230 is disabled. A logic high level writing driver driving signal WDEQ is generated only when the signal logic levels of the input and output line IO and the data input line DIO are different from each other, so that the writing driver 230 is enabled. As shown in FIG. 6, the writing driver driving signal WDEQ is fed back to the third logic gate 258 in the comparing unit 252, which secures a sufficient amount of writing time after the writing driver 230 is enabled.

Referring back to FIG. 5, when the writing driver 230 is enabled in response to a logic high level writing driver driving signal WDEQ, data on the pair of data lines DIO and DIOB is transferred to the pair of input and output lines IO and IOB.

When the writing driver driving signal WDEQ is fed back to an input port of the third logic gate 258 as shown in FIG. 6, it remains at an activation state while the writing driver enable signal WDE is at a logic high level. When the writing driver 230 is enabled, since the data on the pair of input and output lines IO and IOB is different from the data on the pair of data input lines DI and DIB, the writing driver driving signal WDEG is fed back. Therefore, a sufficient amount of time required to write data to the memory cells MC is secured.

Figure 7:
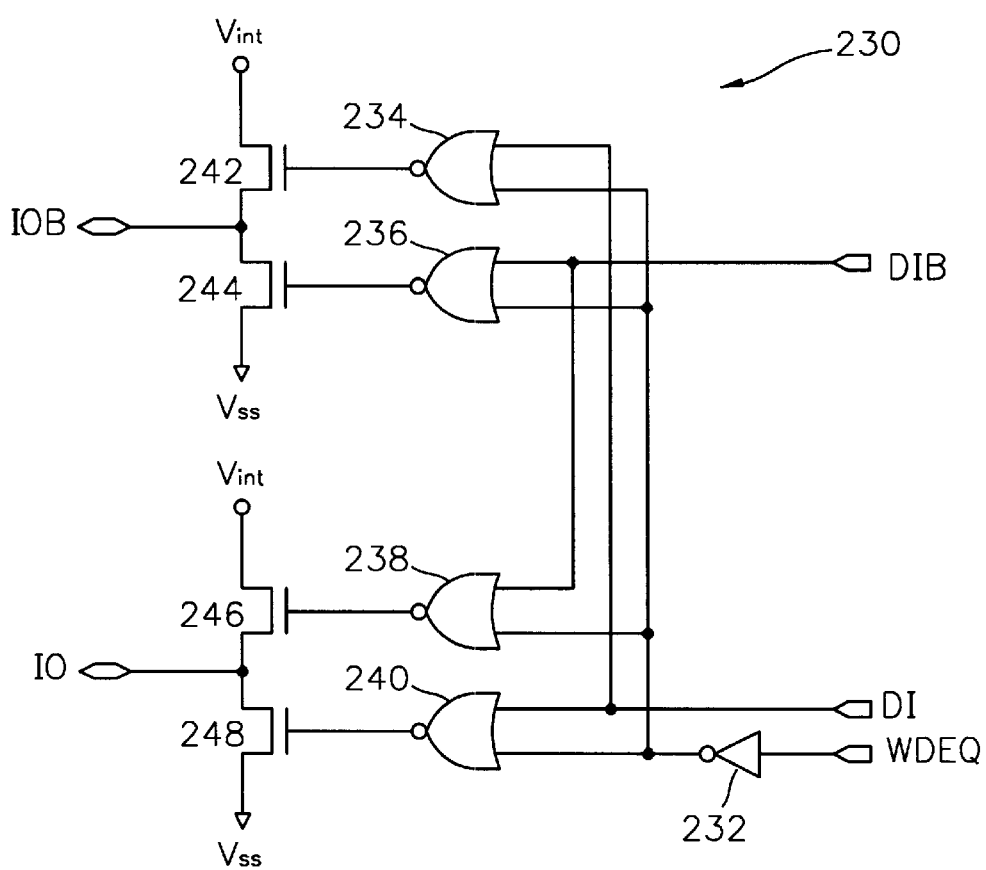
FIG. 7 is a circuit diagram of the writing driver shown in FIG. 5.

Referring to FIG. 7, which is a circuit diagram illustrating in detail the writing driver 230 shown in FIG. 5, the write driver 230 is enabled in response to the activation of the write driver driving signal WDEQ, and transfers the data on the pair of data input lines DI and DIB from the data input buffer 270 of FIG. 5 to the pair of input and output lines IO and IOB. It is preferable that the writing driver 230 includes an inverter 232, a plurality of logic gates 234, 236, 238 and 240, pull-up transistors 242 and 246, and pull-down transistors 244 and 248.

The inverter 232 inverts the writing driver driving signal WDEQ. One input of each of the plurality of logic gates, e.g., four logic gates 234, 236, 238 and 240 is connected to the output of the inverter 232, and the other input thereof is connected to the data input line DIO or DIOB. The pull-up transistors 242 and 246 are enabled in response to the output signals from logic gates 234 and 238. When the writing driver driving signal WDEQ is deactivated, the writing driver 230 is disabled. The configuration and operation of the writing driver 230 are apparent to those skilled in the art, and accordingly are not described in detail in this specification.

According to the present invention, when the previously-read or previously-written data is the same as the current data to be read or written, an input and output sense amplifier or a writing driver is disabled, but when they are different from each other, the input and output sense amplifier or writing driver is enabled. The input and output sense amplifier or writing driver operates only when the previously-read or previously-written data is not the same as the current data to be read or written, thus reducing power consumption due to unnecessary operation.

Although the invention has been described with reference to a particular embodiment, it will be apparent to one of ordinary skill in the art that modifications of the described embodiment may be made without departing from the spirit and scope of the invention.

I claim:

1. A memory device for reading and writing of data to a memory, the memory device comprising:

an input and output sense amplifier for amplifying data read from a memory cell of the memory and transferred to an input and output line, and transferring the read data to a data output line; and a writing driver circuit for receiving write data via a data input line and transferring the received write data to the input and output line, wherein each of the input and output sense amplifier and the writing driver circuit operates only when previously-read or previously-written data is different from current data to be read or written.

2. The memory device of claim 1, further comprising:

an input and output sense amplifier driving unit for generating an input and output sense amplifier driving signal to control the input and output sense amplifier such that the input and output sense amplifier is deactivated when previously read data on the data output line is the same as current read data on the input and output line, and to activate the input and output sense amplifier when the previously read data is different from the current read data; and a writing driver driving circuit for generating a writing driver driving signal for controlling the writing driver such that the writing driver is deactivated when previous write data on the input and output line is the same as current write data on the data input line, and generating a writing driver driving signal to activate the writing driver when the previous write data is different from the current write data.

3. A memory device which transfers data read from a selected memory cell to an input and output line and outputs the data via a data output line, the device comprising:
- an input and output sense amplifier which amplifies data read from the memory cell and transfers the amplified data to an output of the sense amplifier;
- a latch unit having an input coupled to the output of the sense amplifier for receiving and latching data received from the output of the sense amplifier, and providing the latched data to an output of the latch unit; and
- an input and output sense amplifier driving unit coupled to the input and output line and to the latch unit for comparing previously read data on the data output line with current read data on the input and output line, and generating an input and output sense amplifier driving signal for activating the input and output sense amplifier only when the previously read data is different from the current read data.

4. The memory device of claim 3, wherein the input and output sense amplifier driving signal is deactivated when the previous read data on the data output line is the same as the current read data on the input and output line, and activated when the previous read data is different from the current read data.

5. A memory device which transfers data read from a selected memory cell to an input and output line and outputs the data via a data output line, the device comprising:
- an input and output sense amplifier which amplifies data read from the memory cell and transfers the amplified data to an output of the sense amplifier;
- a latch unit having an input coupled to the output of the sense amplifier for receiving and latching data received from the output of the sense amplifier, and providing the latched data to an output of the latch unit; and
- an input and output sense amplifier driving unit coupled to the input and output line and to the latch unit for comparing previously read data on the data output line with current read data on the input and output line, and generating an input and output sense amplifier driving signal for activating or deactivating the input and output sense amplifier as a function of the result of the comparison;
- wherein the input and output sense amplifier driving unit comprises:
  - a comparing unit which compares data on the input and output line with data on the data output line, and generates a control signal depending on the results of the comparison; and
  - a logic unit which receives the control signal and an input and output sense amplifier enable signal which is activated when the memory device enters into a read mode, and generates the input and output sense amplifier driving signal.

6. A memory device which transfers write data, which is received from an external source via a data input line, to an input and output line, and writes the write data to a selected memory cell, the device comprising:
- a writing driver which transfers the write data received via the data input line, to the input and output line; and
- a writing driver driving unit which compares the write data on the data input line with the write data on the input and output line, and generates a writing driver driving signal for controlling the writing driver,
- wherein the writing driver operates only when previous write data is different from current write data.

7. The memory device of claim 6, wherein the writing driver driving signal is deactivated when previous write data on the input and output line is the same as current write data on the data input line, and activated when the previous write data is different from the current write data.

8. The memory device of claim 7, wherein the writing driver driving unit comprises:
- a comparing unit which compares data on the input and output line with data on the data input line, and generates a control signal depending on the results of the comparison; and
- a logic unit which receives the control signal and a writing driver enable signal which is activated when the memory device enters into a write mode, and generates the writing driver driving signal,
- wherein the comparing unit receives the output signal of the logic unit so that the writing driver driving signal remains in an activated state while the writing driver enable signal is activated and after the writing driver signal is activated.

9. A data reading/writing method of a memory device including an input and output sense amplifier for amplifying data which has been read from a memory cell and transferred to an input and output line, and transferring the resultant data to a data output line, and a writing driver for receiving write data via a data input line and transferring the received write data to the input and output line, the method comprising the steps of:
- (a) comparing previously-read data on the data output with current read data, which is on the input and output line, and comparing previously-written data on the input and output line with current data to be written which is on the data input line; and
- (b) generating a control signal for enabling or disabling the input and output sense amplifier and the writing driver as a function of the results of the comparison.

10. The method of claim 9, wherein the control signal is deactivated when the previously-read/written data is the same as the current data to be read/written, and activated when the previously-read/written data is different from the current data to be read/written.

* * * * *